(12) United States Patent
Ashwood et al.

(10) Patent No.: US 11,181,757 B1
(45) Date of Patent: Nov. 23, 2021

(54) HEAT MANAGEMENT IN WIRELESS ELECTRONIC DEVICES

(71) Applicant: Snap Inc., Venice, CA (US)

(72) Inventors: Andrea Ashwood, Los Angeles, CA (US); Patrick Kusbel, Longmont, CO (US); Jun Lin, Culver City, CA (US); Douglas Wayne Moskowitz, Marina Del Rey, CA (US); Ugur Olgun, Venice, CA (US); Russell Douglas Patton, Marina Del Rey, CA (US); Patrick Timothy McSweeney Simons, Downey, CA (US); Stephen Andrew Steger, Santa Monica, CA (US)

(73) Assignee: Snap Inc., Santa Monica, CA (US)

( * ) Notice: Subject to any disclaimer, the term of this patent is extended or adjusted under 35 U.S.C. 154(b) by 429 days.

(21) Appl. No.: 15/913,781

(22) Filed: Mar. 6, 2018

Related U.S. Application Data

(60) Provisional application No. 62/467,675, filed on Mar. 6, 2017.

(51) Int. Cl.
| | |
|---|---|
| *G02C 11/00* | (2006.01) |
| *H05K 1/02* | (2006.01) |
| *H05K 7/20* | (2006.01) |
| *H01Q 1/02* | (2006.01) |
| *H01Q 1/27* | (2006.01) |

(Continued)

(52) U.S. Cl.
CPC ............... *G02C 11/10* (2013.01); *H01Q 1/02* (2013.01); *H01Q 1/273* (2013.01); *H01Q 1/38* (2013.01); *H05K 1/0203* (2013.01); *H05K 7/2039* (2013.01); *G02C 5/22* (2013.01); *H05K 2201/10098* (2013.01)

(58) Field of Classification Search
None
See application file for complete search history.

(56) References Cited

U.S. PATENT DOCUMENTS

| | | | |
|---|---|---|---|
| 6,619,799 | B1 | 9/2003 | Blum et al. |
| 7,903,034 | B2 | 3/2011 | Anguera et al. |

(Continued)

FOREIGN PATENT DOCUMENTS

| | | |
|---|---|---|
| CN | 201060333 Y | 5/2008 |
| CN | 202033539 | 11/2011 |

(Continued)

OTHER PUBLICATIONS

"U.S. Appl. No. 15/913,762, Non Final Office Action dated Mar. 19, 2019", 10 pgs.

(Continued)

*Primary Examiner* — Christopher Stanford
*Assistant Examiner* — Journey F Sumlar
(74) *Attorney, Agent, or Firm* — Schwegman Lundberg & Woessner, P.A.

(57) ABSTRACT

An eyewear device has an antenna system having at least one element which contributes to wireless signal transmission, and which is thermally connected to a heat-generating electronic component of the eyewear device to serve as a heat sink for the electronic component. A driven antenna element and/or a plurality of PCB extenders electrically connected to a PCB ground plane can thus be employed for both signal transmission and heat management.

15 Claims, 9 Drawing Sheets

(51) Int. Cl.
*H01Q 1/38* (2006.01)
*G02C 5/22* (2006.01)

(56) References Cited

U.S. PATENT DOCUMENTS

| | | | |
|---|---|---|---|
| 9,482,882 | B1 | 11/2016 | Hanover et al. |
| 9,496,601 | B1 | 11/2016 | Bevelacqua et al. |
| 9,726,904 | B1 | 8/2017 | Lin |
| 9,851,585 | B2 | 12/2017 | Ashwood |
| 2002/0061734 | A1 | 5/2002 | Ito |
| 2004/0125029 | A1 | 7/2004 | Maoz et al. |
| 2005/0212706 | A1 | 9/2005 | Ying et al. |
| 2005/0280596 | A1 | 12/2005 | Tang et al. |
| 2007/0057854 | A1 | 3/2007 | Oodachi et al. |
| 2007/0120746 | A1 | 5/2007 | Bit-babik et al. |
| 2007/0159401 | A1 | 7/2007 | Baliarda et al. |
| 2007/0182636 | A1 | 8/2007 | Carlson |
| 2008/0143954 | A1 | 6/2008 | Abreu |
| 2008/0150828 | A1 | 6/2008 | An et al. |
| 2008/0238780 | A1 | 10/2008 | Ponce et al. |
| 2008/0252536 | A1 | 10/2008 | Anguera et al. |
| 2010/0214175 | A1 | 8/2010 | Hui et al. |
| 2010/0214180 | A1 | 8/2010 | Krogerus |
| 2011/0175776 | A1 | 7/2011 | Anguera et al. |
| 2011/0242480 | A1* | 10/2011 | Reichow ............... G02C 5/10 351/159.6 |
| 2012/0235900 | A1 | 9/2012 | Border et al. |
| 2012/0256804 | A1 | 10/2012 | Ban et al. |
| 2013/0044036 | A1 | 2/2013 | Kuonanoja |
| 2013/0169504 | A1 | 7/2013 | Jenwatanavet |
| 2013/0342420 | A1 | 12/2013 | Lu |
| 2014/0028966 | A1 | 1/2014 | Blum et al. |
| 2014/0240474 | A1 | 8/2014 | Kondo |
| 2014/0270244 | A1* | 9/2014 | Fan ...................... G10K 11/002 381/91 |
| 2015/0364822 | A1 | 12/2015 | O'driscoll |
| 2016/0099501 | A1 | 4/2016 | Rowson et al. |
| 2016/0227009 | A1 | 8/2016 | Kim et al. |
| 2016/0252728 | A1* | 9/2016 | Mack ................ G02B 27/0176 351/158 |
| 2016/0349539 | A1 | 12/2016 | Waisman et al. |
| 2016/0370606 | A1 | 12/2016 | Huynh |
| 2017/0025743 | A1 | 1/2017 | Kim et al. |
| 2017/0026744 | A1 | 1/2017 | Farzbod et al. |
| 2018/0052276 | A1* | 2/2018 | Klienman ............ G02B 6/0023 |
| 2018/0136491 | A1* | 5/2018 | Ashwood ............... G02C 11/10 |
| 2020/0119433 | A1 | 4/2020 | Ashwood et al. |

FOREIGN PATENT DOCUMENTS

| | | |
|---|---|---|
| CN | 103168390 A | 6/2013 |
| CN | 110383579 A | 10/2019 |
| EP | 2768075 | 8/2014 |
| EP | 2775627 A1 | 9/2014 |
| TW | 201432342 A | 8/2014 |
| WO | 2018165201 | 9/2018 |

OTHER PUBLICATIONS

Cihangir, Aykut, et al., "4G Antennas for Wireless Eyewear Devices and Related SAR", Comptes Rendus Phys., vol. 16, No. 9, (2015), 17 pgs.

Cihangir, Aykut, et al., "Feasibility Study of 4G Cellular Antennas for Eyewear Communicating Devices", IEEE Antennas and Wireless Propagation Letters, Vol, 12, (2013), 4 pgs.

Hong, Seungman, et al., "Transparent and Flexible Antenna for Wearable Glasses Applications", IEEE Transactions on Antennas and Propagation, 64(7), (Jul. 2016), 8 pgs.

"International Application Serial No. PCT US2018 021211, International Search Report dated Jun. 12, 2018", 4 pgs.

"International Application Serial No. PCT US2018 021211, Written Opinion dated Jun. 12, 2018", 8 pgs.

"U.S. Appl. No. 15/913,762, Final Office Action dated Jan. 24, 2020", 11 pgs.

"U.S. Appl. No. 15/913,762, Response filed May 26, 2020 to Final Office Action dated Jan. 24, 2020", 11 pgs.

"U.S. Appl. No. 15/913,762, Response filed Sep. 19, 2019 to Non-Final Office Action dated Mar. 19, 2019", 9 pgs.

"European Application Serial No. 18713483.8, Response filed Apr. 9, 2020 to Office Action dated Oct. 15, 2019", 26 pgs.

"International Application Serial No. PCT/US2018/021211, International Preliminary Report on Patentability dated Sep. 19, 2019", 10 pgs.

"U.S. Appl. No. 15/913,762, Non Final Office Action dated Nov. 13, 2020", 13 pgs.

"Chinese Application Serial No. 201880016073.6, Office Action dated Aug. 31, 2020", w/ English translation, 19 pgs.

"Chinese Application Serial No. 201880016073.6, Response filed Jan. 14, 2021 to Office Action dated Aug. 31, 2020", w/ English Claims, 9 pgs.

"Korean Application Serial No. 10-2019-7028817, Notice of Preliminary Rejection dated Aug. 18, 2020", w/ English translation, 10 pgs.

"Korean Application Serial No. 10-2019-7028817, Response Filed on Oct. 16, 2020 to Notice of Preliminary Rejection dated Aug. 18, 2020", w/ English Claims, 24 pgs.

"Korean Application Serial No. 10-2019-7028817, Notice of Preliminary Rejection dated Feb. 22, 2021", w/ English Translation, 12 pgs.

"U.S. Appl. No. 15/913,762, Response filed Apr. 13, 2021 to Non Final Office Action dated Nov. 13, 2020", 11 pgs.

"Chinese Application Serial No. 201880016073.6, Office Action dated Apr. 22, 2021", w/ English Translation, 13 pgs.

"U.S. Appl. No. 15/913,762, Final Office Action dated Aug. 17, 2021", 12 pgs.

\* cited by examiner

HEAT MANAGEMENT IN WIRELESS ELECTRONIC DEVICES

PRIORITY APPLICATION

This application claims priority to U.S. Provisional Application Ser. No. 62/467,675, filed Mar. 6, 2017, the disclosure of which is incorporated herein in its entirety by reference.

TECHNICAL FIELD

This disclosure relates generally to wireless communication. Aspects of the disclosure relate to wireless communication systems, antenna systems forming part of such wireless communication systems, and electronic devices with wireless communication functionality. The disclosure further relates to electronics-enabled eyewear devices.

BACKGROUND

Recent trends in consumer electronics have consistently been towards greater miniaturization, while the functionalities of such devices demand increasingly ubiquitous wireless connectivity. Wireless communication systems forming part of electronic devices with a limited form factor struggle to meet the conflicting requirements for increasing compactness while achieving wireless connectivity capable of reliably transferring large amounts of data (e.g., video captured by a pair of smart glasses). These difficulties are exacerbated in wearable devices, where battery power is often at a premium.

In wearable electronic devices, these difficulties are often compounded by heat management considerations. Heat management for such wearable electronics-enabled devices can be problematic owing to space and/or weight constraints. Moreover, cooling by exposure to the ambient atmosphere is often not an option in wearable devices, considering that the exterior of such a device is often in regular contact with parts of a user's body.

BRIEF DESCRIPTION OF THE DRAWINGS

The present disclosure is illustrated by way of example, not by way of limitation, in the accompanying drawings, in which.

INTRODUCTION

As mentioned, progress in electrical engineering has enabled electronic products to become physically smaller and deliver increasingly greater functionality. A bottleneck in achieving further progress is the relatively slower pace of antenna system miniaturization. In antenna miniaturization, particularly, a popular view is that transmissive performance is approaching limits dictated by physics in view of the size of the relevant components. A brief overview of antenna trends in recent consumer electronics technology is instructive in this regard.

Figure 1:
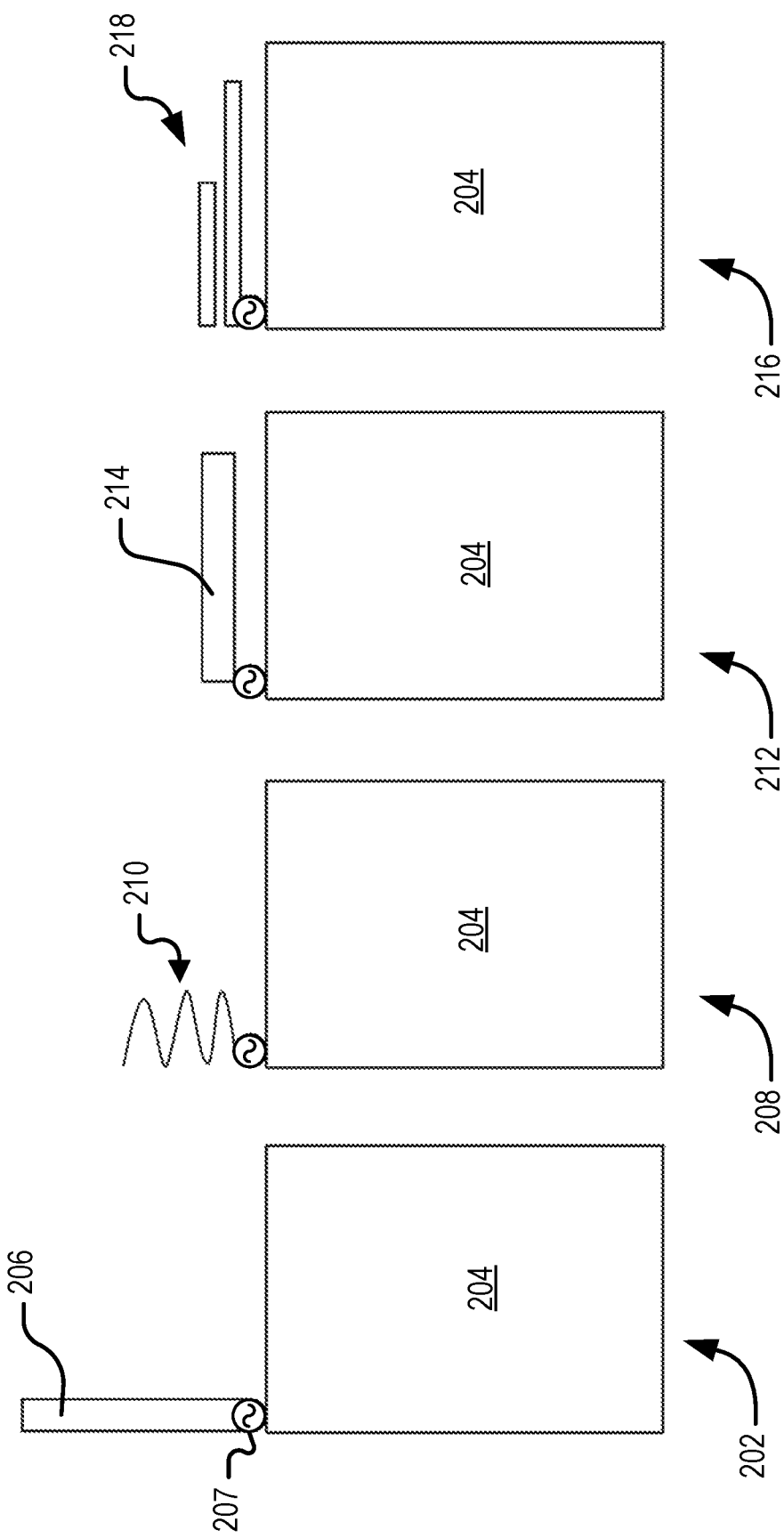
FIG. 1 is a series of schematic representations of existing configurations for wireless communication systems in electronic devices, illustrating progressive stages of historical antenna miniaturization.

FIG. 1 provides a schematic overview of the history of antenna systems in consumer electronics with wireless connectivity. The antenna systems for these purposes typically operate at microwave frequencies (300 MHz to 30 GHz). Four different antenna configurations are illustrated by idealized schematic representation of antenna systems 202, 208, 212, and 216. Each of the illustrated antenna systems comprises a driven antenna element connected to communication electronics (e.g., a transceiver system) incorporated in a printed circuit board (PCB) 204. The PCB 204 is connected to the driven antenna at a signal feed, schematically represented by reference numeral 207. It will be seen that the differences between the illustrated systems of FIG. 1 lie in variation in the size, shape, and/or orientation of the driven antenna element relative to the PCB 204.

As illustrated schematically by antenna configuration 202, early consumer electronic devices had comparatively long monopole antennas 206. These antennas can still be seen in walkie-talkies or some performance-demanding wireless communication devices such as military radios. In the pursuit of miniaturization, such monopole antennas 206 were replaced in consumer electronics by helical antennas 210. This meant keeping the same length of antenna metal while confining it in a smaller space. The result was antenna miniaturization with minimal performance impact. Next generation devices, schematically represented by system 212 replaced these helical antennas with inverted monopole antennas 214, achieving even greater compactness. Inverted monopole antennas 214 also allowed embedding thereof inside the consumer electronic devices, since the technology significantly reduced the volume occupied by the driven antenna element 214. The performance of this antenna technology, albeit inferior to the previous generations, was sufficient for contemporary consumer electronic devices due to significant improvements in radiofrequency (RF) infrastructure, and because the antenna still receives contributions to radiation from the PCB 204.

Note that the PCB 204 in such systems is a part of the total radiating system, the PCB 204 also being referred to in the literature as ground plane. The PCB 204 thus cooperates with the driven antenna element in the communication of wireless signals. The main PCB 204 of these devices is essentially the other "pole" that balances the monopole and carries electric currents that causes efficient RF radiation. In PCBs 204, a ground plane is often provided by a comparatively large area of copper foil on a board of the PCB 204, with the metal foil being connected to a power supply ground terminal and serving as a return path for current from different components on the board. For this reason, the signal feed 207 is shown in FIG. 1 as being connected between the driven antenna element and the PCB 204.

Depending on the tuning of the antenna system and the relative sizes and orientation of the PCB ground plane and the driven antenna element, a monopole antenna element 206 such as that of system 202 can be viewed as and can behave analogously to an offset-fed dipole antenna, with the different arms of the dipole being provided by the monopole conductor 206 at the PCB 204 respectively.

Inverted monopoles take advantage of the phenomena associated with the PCB ground plane. Adding more inverted monopoles 218 of different lengths (shown schematically by antenna system 216) enabled simultaneous wireless communication capability on different radio bands. In essence, this meant more bandwidth and faster communication speeds while sacrificing little antenna volume. Increased reliance was, however, placed on the PCB 204 for antenna performance.

With the advent of the internet of things and Bluetooth Low Energy (BLE), the demand for consumer electronics with wireless connectivity, and the performance demands for such devices, has increased significantly. These developments necessitated the inclusion of antennas in devices that previously had none, like refrigerators, digital cameras, offshore wind farms, sensors, controllers, and so forth. Some of these devices have physical form factors too small to have a physical aperture (i.e., neither the antenna volume nor the ground area), to support an efficient radiator. As a result, these systems thus far had to be content with narrow bandwidth, poor efficiency and slower speeds.

Electronics-enabled eyewear devices typically have a relatively small available physical volume for electrical circuitry to provide the various functionalities of the device. The length of the PCB ground plane provided by the integrated PCB 204 is in some such existing devices smaller than one tenth of the wavelength ($\lambda/10$) at the lowest transmitting frequency. A length of at least one fourth of the wavelength ($\lambda/10$) is usually considered to be necessary for efficient radiation. Thus, existing antenna systems for many electronic devices are incapable of providing sufficiently efficient wireless data transfer for functionalities such as uploading high-definition video captured by the eyewear device to other devices, particularly limitations of battery-powered operation are considered.

DETAILED DESCRIPTION

The description that follows discusses illustrative embodiments of the disclosure. In the following description, for the purposes of explanation, numerous specific details are set forth in order to provide an understanding of various embodiments of the disclosed subject matter. It will be evident, however, to those skilled in the art, that embodiments of the disclosed subject matter may be practiced without these specific details. In general, well-known instruction instances, protocols, structures, and techniques are not necessarily shown in detail.

A first aspect of the disclosure provides for an eyewear device comprising:
a body for wearing by a user to hold one or more optical elements within view of the user;
onboard electronics carried by a PCB that is incorporated in the body; and
a driven antenna element connected to the PCB and projecting away from the PCB, the driven antenna element being housed within the body of the eyewear article.

The driven antenna element is a conductive element which is electrically connected to a receiver and/or transmitter. In a transmitting antenna, the driven antenna element is driven or excited by current from communication electronics connected thereto (e.g., via the signal feed 207 as discussed in FIG. 1), and is the source of transmitted waves. In a receiving antenna, the driven antenna element collects incoming waves for reception, and converts them to oscillating electric currents which are interpreted by the communication electronics connected to the driven antenna element. As discussed previously, a PCB ground plane cooperates with the driven antenna element in such signal communication. The same applies to PCB extenders connected to the PCB ground plane, as discussed later herein.

In some embodiments, the driven antenna element is configured to form a monopole antenna. Such an antenna system may thus have a configuration analogous to system 202 described with reference to FIG. 1. In other embodiments, the antenna element may be arranged in a dipole configuration.

The eyewear body may comprise a frame defining a pair of optical element holders (e.g., lens holders), and a pair of temples connected to opposite lateral end portions of the frame. In one example embodiment, the PCB is housed at or adjacent one of the lateral end portions of the frame. The antenna element may in such cases project from the PCB to extend along at least part of the corresponding lens holder. Thus, in embodiments where the lens holders are a pair of rims extending peripherally around respective lenses, the antenna element may extend from the PCB around at least a portion of the corresponding rim.

An example embodiment of a wireless communication system and an eyewear device according to the first aspect of the disclosure will now be described with reference to FIGS. 2 and 3, after which a number of further aspects of the disclosure will be discussed.

Figure 2:
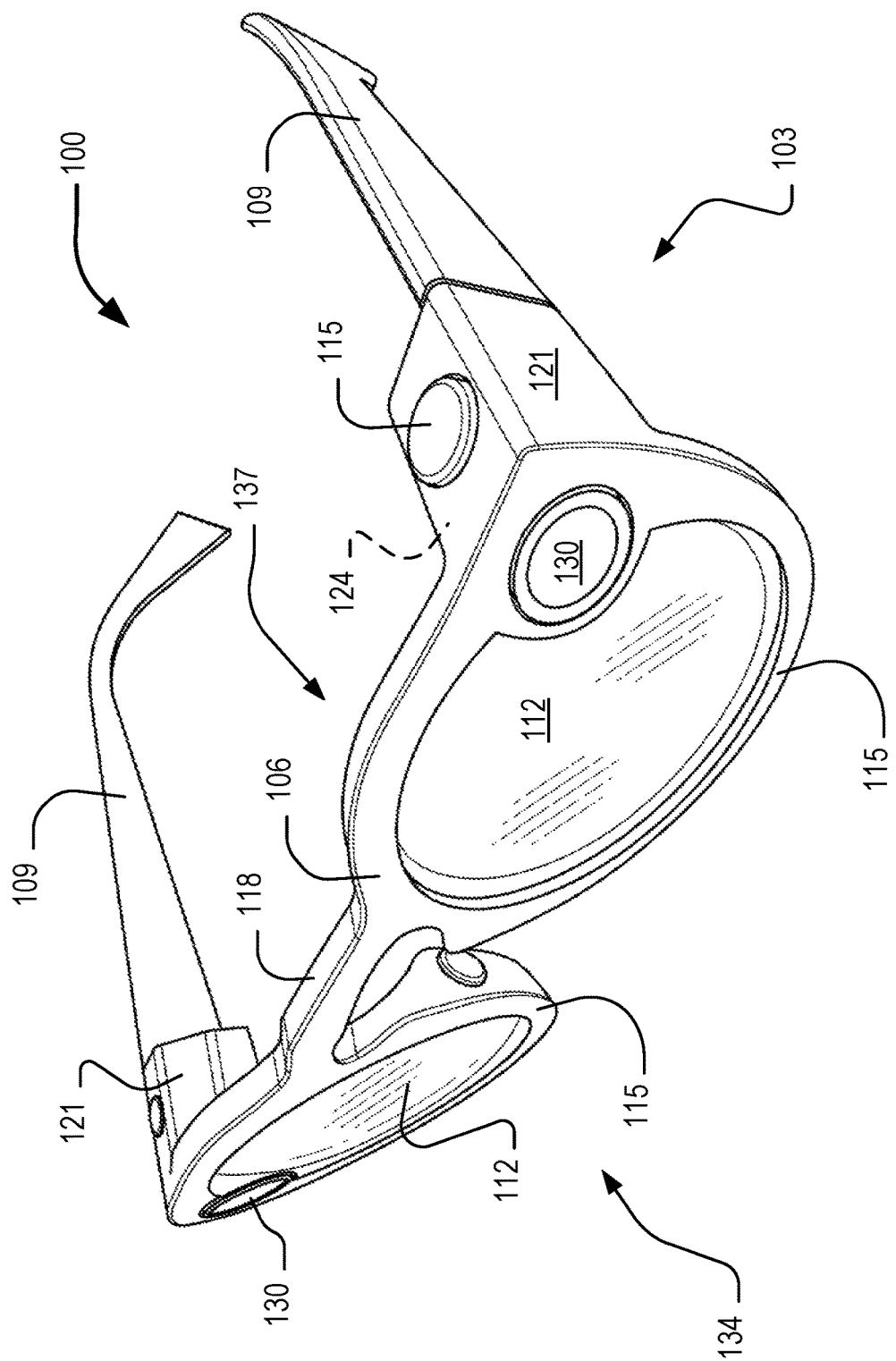
FIG. 2 is a schematic three-dimensional oblique front view of a wearable electronic device in the example form of a pair of an electronics-enabled eyewear device in which various disclosed wireless communication systems can be integrated, according to an example embodiment.

FIG. 2 shows an oblique front view of an electronics-enabled eyewear device 100 in the example form of a pair of smart glasses. The eyewear device 100 includes a body 103 comprising a front piece or frame 106 and a pair of temples 109 connected to the frame 106 for supporting the frame 106 in position on a user's face when the eyewear device 100 is worn. The frame 106 can be made from any suitable material such as plastics or metal, including any suitable shape memory alloy.

The eyewear device 100 has a pair of optical elements in the form of a pair of lenses 112 held by corresponding optical element holders in the form of a pair of lens rims 115 forming part of the frame 106. The rims 115 are connected by a bridge 118. In other embodiments, one or both of the optical elements can be a display, a display assembly, or a lens and display combination. The eyewear device 100 can, in such embodiments, provide a virtual reality headset or an augmented reality display. Description in this example embodiment of elements relating to lenses or lens holders is thus to be read as, in other embodiments, being analogously applicable to different forms of optical elements.

The frame 106 includes a pair of end pieces 121 defining lateral end portions of the frame 106. In this example, a variety of electronics components are housed in one or both of the end pieces 121, as discussed in more detail below. In some embodiments, the frame 106 is formed of a single piece of material, so as to have a unitary or monolithic construction.

The temples 109 are coupled to the respective end pieces 121. In this example, the temples 109 are coupled to the frame 106 by respective hinges so as to be hingedly movable between a wearable configuration (as shown in FIG. 1) and a collapsed configuration in which the temples 109 are pivoted towards the frame 106 to lie substantially flat against it. In other embodiments, the temples 109 can be fixedly connected to the frame 106 or be coupled to the frame 106 by any suitable means. Each of the temples 109 includes a front portion that is coupled to the frame 106 and a rear portion for coupling to the ear of the user, such as the curved earpiece illustrated in the example embodiment of FIG. 1.

In this description, directional terms such as front, back, forwards, rearwards, outwards and inwards are to be understood with reference to a direction of view of a user when the eyewear device 100 is worn. Thus, the frame 106 has an outwardly directed front side 134 facing away from the user when worn, and an opposite inwardly directed rear side 137 side facing towards the user when the eyewear device 100 is worn. Similarly, the terms horizontal and vertical as used in this description with reference to different features of the eyewear device 100 are to be understood as corresponding to the orientation of the eyewear device 100 when it is level on the face of a user looking forwards. A lateral direction of the eyewear device 100 extends more or less horizontally between the end pieces 121, while a vertical or upright direction of the eyewear device 100 extends transversely to the horizontal direction, such that the lenses 112 have a more or less vertical or upright orientation.

The eyewear device 100 has onboard electronics 124 including a computing device, such as a computer, which can, in different embodiments, be of any suitable type so as to be carried by the body 103. In some embodiments, various components comprising the onboard electronics 124 are at least partially housed in one or both of the temples 109. In the present embodiment, various components of the onboard electronics 124 are housed in the lateral end pieces 121 of the frame 106. The onboard electronics 124 includes one or more processors with memory, wireless communication circuitry (e.g., a transceiver system), and a power source (in this example embodiment being a rechargeable battery, e.g. a lithium-ion battery). The onboard electronics 124 comprises low-power, high-speed circuitry, and, in some embodiments, a display processor. Various embodiments may include these elements in different configurations or integrated together in different ways. As will be discussed below with reference to FIG. 3, at least part of the onboard electronics 124 is in this example embodiment provided by a PCB 204 housed in one of the end pieces 121.

The onboard electronics 124 includes a rechargeable battery. In some embodiments, the battery is disposed in one of the temples 109. In this example embodiment, however, the battery is housed in one of the end pieces 121, being electrically coupled to the remainder of the onboard electronics 124.

The eyewear device 100 is camera-enabled, in this example comprising a camera 130 mounted in one of the end pieces 121 and facing forwards so as to be aligned more or less with the direction of view of a wearer of the eyewear device 100. The camera 130 is configured to capture digital photographic as well as digital video content. Operation of the camera 130 is controlled by a camera controller provided by the onboard electronics 124, image data representative of images or video captured by the camera 130 being temporarily stored on a memory forming part of the onboard electronics 124. The memory is in communication with a wireless communication system (see item 300 in FIG. 3) incorporated in the eyewear body 103, thus to enable wireless upload to other devices of video content captured by the camera 130. In some embodiments, the eyewear device 100 can have a pair of cameras 130, e.g. housed by the respective end pieces 121.

The eyewear device 100 further includes one or more input and output devices permitting communication with and control of the camera 130. In particular, the eyewear device 100 includes one or more input mechanisms for enabling user control of one or more functions of the eyewear device 100. In this embodiment, the input mechanism comprises a button 115 mounted on the frame 106 so as to be accessible on top of one of the end pieces 121 for pressing by the user.

Figure 3:
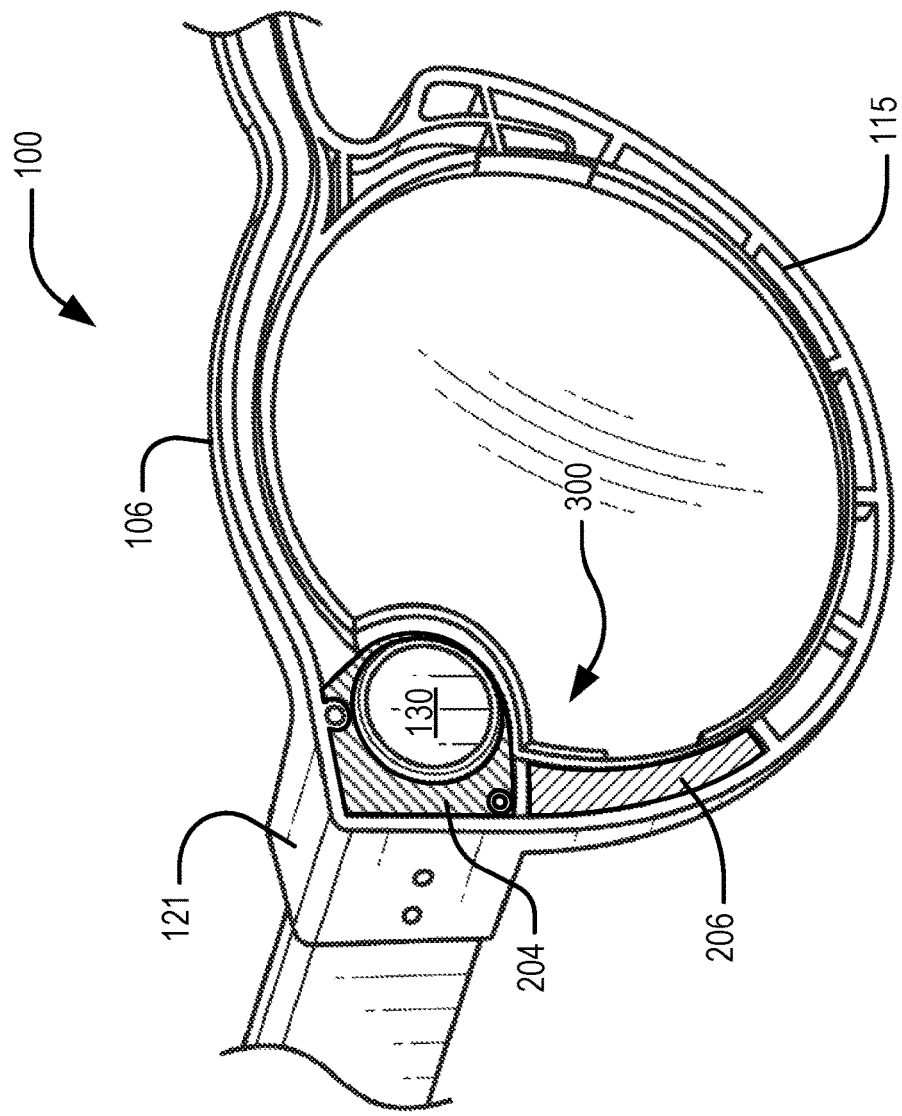
FIG. 3 is a partially exposed front view of a part of an electronics-enabled eyewear device incorporating a wireless communication system having a driven antenna element that projects from a printed circuit board (PCB) and that is housed within a frame of the eyewear device, according to one example embodiment.

As best seen with reference to FIG. 3 (in which the frame 106 is shown in vertical section), the eyewear device 100 has an integrated wireless communication system 300 for wireless communication with external electronic components or devices. To this end, communication electronics in the form of a transceiver carried on a PCB 204 housed in one of the end pieces 121 is coupled to an antenna element 206 provided by non-loop conductor integrated in the body 103 of the eyewear device 100. The PCB 204 defines a PCB ground plane, as discussed previously. The antenna element 206 is substantially coplanar with the PCB 204, projecting away from the PCB 204. It will thus be seen that the wireless communication system 300 corresponds broadly to the antenna configuration described with reference to system 202 of FIG. 1.

The main PCB 204 has an operatively vertical orientation, extending laterally to be substantially coplanar with the frame 106 of the eyewear device 100. Due to the relatively small physical size of the PCB 204, relying on the main PCB ground plane as a primary radiating aperture, consistent with conventional inverted antenna configurations, would result in suboptimal performance. In this example embodiment, a dipole concept is utilized by embedding inside the frame 106, in the form of the antenna element 206, a driven antenna element long enough for efficient radiation. In this example embodiment, the length of the antenna element 206 is larger than the length of the coplanar PCB ground plane by a factor of about 1.5. In particular, the antenna element 206 in this instance has a length of about $\lambda/8$, while the PCB ground plane has a length of about $\lambda/12$. In other embodiments, the antenna element 206 may be twice or more the length of the PCB ground plane. The antenna element 206 is in this example embodiment placed on the same side of the frame 106 as the main PCB 204 and accomplishes reasonably efficient radiation. As will be discussed later herein, however, the efficiency of the antenna system is in other embodiments greatly improved by the addition of one or more PCB extenders.

As can be seen in FIG. 3, the monopole antenna element 206 is in this example embodiment embedded within the frame 106 to project away from the PCB 204, extending more or less downward along part of the corresponding lens rim 115. In other embodiments, the dipole antenna element 206 can be replaced with a monopole antenna element. It will thus be seen that the configuration of the antenna system 300 is similar to that of system 202 in FIG. 1.

In accordance with another aspect of the disclosure (discussed later below, broadly, as a fourth aspect of the disclosure), the driven antenna element 206 is thermally connected to one or more heat-generating electronics components of the eyewear device 100. Because the driven antenna element 206 is a metal component that is thus in heat exchange relationship with such resources, the antenna element 206 serves as a heat sink. The antenna element 206 is in this example embodiment thermally coupled to the PCB 204 for heat management of the PCB 204. Instead, or in addition, the antenna element 206 can be connected to other heat-generating components, such as a battery.

A second aspect of the disclosure provides for an antenna system having one or more PCB extenders connected to a PCB for co-operating with a driven antenna element in signal communication, each PCB extender comprising a conductor connected to and projecting from the PCB ground plane to define a respective ground plane. The second aspect extends to a device including such an antenna system, and to an eyewear device having incorporated therein such an antenna system. Provision of a PCB extender having a length dimension significantly larger than a largest dimension of the PCB ground plane delivers an improved radiating aperture for the antenna system.

In some embodiments, the antenna system has two or more PCB extenders defining respective ground planes with different orientations, so that the driven antenna element cooperates simultaneously with two or more differently oriented ground planes. In some embodiments, at least two of the PCB extenders different in length and/or other dimensions.

Differently defined, a third aspect of the disclosure provides an antenna system that comprises: a PCB defining a PCB ground plane; a driven antenna element coupled to communication electronics carried by the PCB; and a plurality of PCB extenders electrically connected to the PCB ground plane and projecting from the PCB in mutually transverse directions. The plurality of PCB extenders thus defines a plurality of ground planes having different spatial orientations relative to the driven antenna element. The third aspect of the disclosure extends to a device including such an antenna system, and to an eyewear device having incorporated therein such an antenna system. For ease of description, antenna configurations consistent with the third aspect of the disclosure are also referred to herein as multi-plane antenna systems. Such embodiments can deliver multiband functionality, reduced size and/or improved pattern diversity.

Before describing (with reference to FIG. 7-9) specific example embodiments consistent with the third aspect of the disclosure, there will now follow a brief review of antenna theory related to inverted-L antennas, together with a brief discussion of technical aspects of the disclosed multi-plane antenna configuration.

Figure 4:
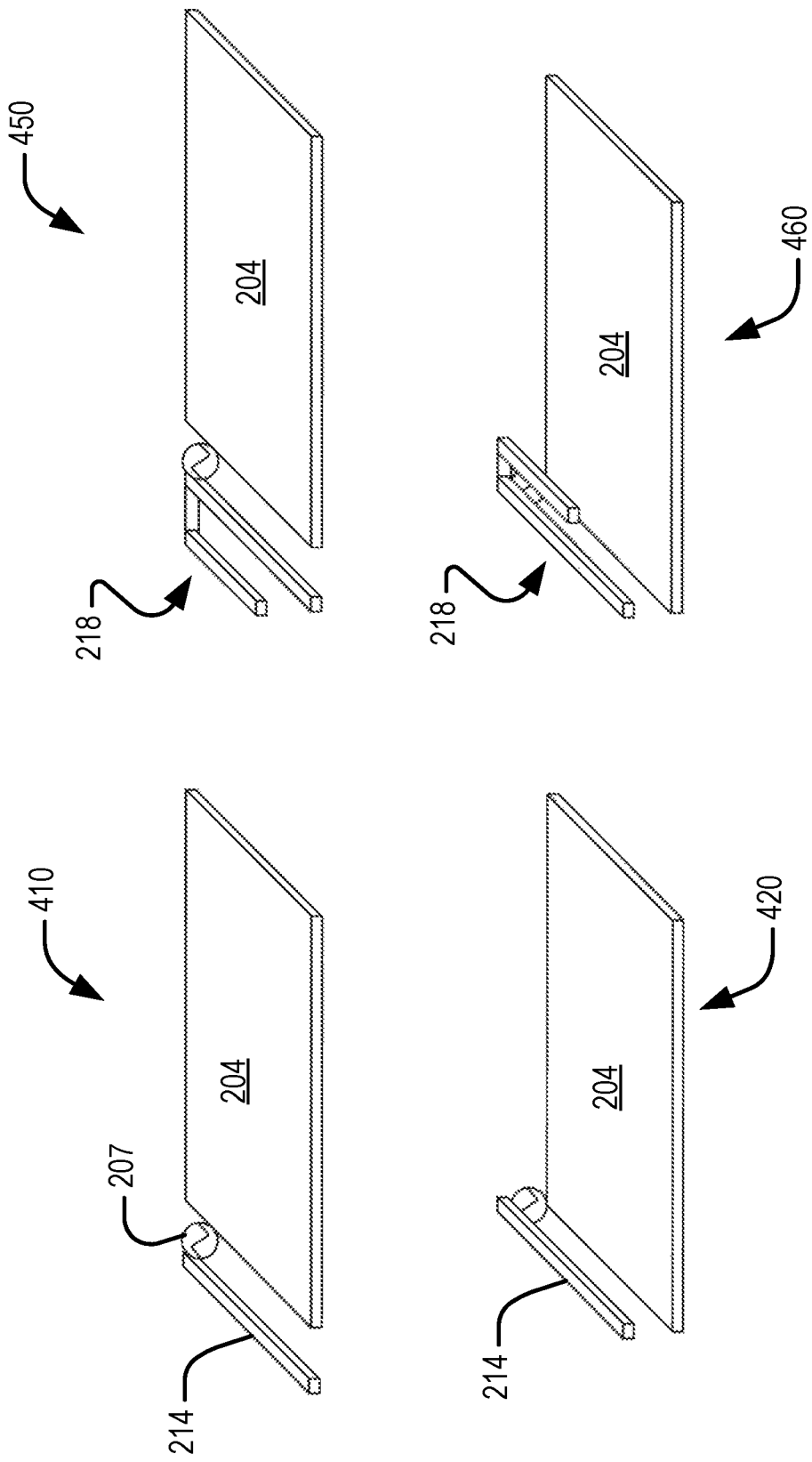
FIG. 4 is a series of schematic representations of different versions of antenna systems having inverted-L antennas according to established principles.

A number of existing systems with different configurations of inverted-L antennae are presented in FIG. 4. The leftmost two systems (indicated respectively by reference numerals 410 and 420) show single band inverted-L antenna technologies. Like reference numerals indicate like components in FIG. 1 and in FIG. 4. System 410 shows an idealized schematic representation of a configuration known as an inverted-L antenna (ILA), in which the PCB 204 (and hence the PCB ground plane) and the driven antenna element 214 are on the same plane. This corresponds to system 212 in FIG. 1. In contrast, system 420 shows a configuration known as a planar inverted-L antenna (PILA), in which the driven antenna element 214 and the PCB 204 are on different but parallel planes. Systems 450 and 460 depict multiband versions of the ILA 410 and the PILA 420, respectively, where antenna elements 218 of different lengths are connected to the same PCB ground plane to support simultaneous wireless functionality on different frequency bands. These antenna implementations are common in consumer electronics devices with wireless capabilities.

Based partly on the insight that the PCB 204 can be considered as providing the other pole of these inverted-L monopole antennas, the third aspect of this disclosure proposes an antenna system structure in which the driven antenna element is shared between multiple ground planes. In some embodiments, these ground planes may be of different lengths and dimensions. Note that such a proposed multi-plane antenna system can be understood as a reciprocal approach to the multiband inverted-L antennas (450, 460), where multiple antenna elements 218 share a single PCB ground plane.

Figure 5B:
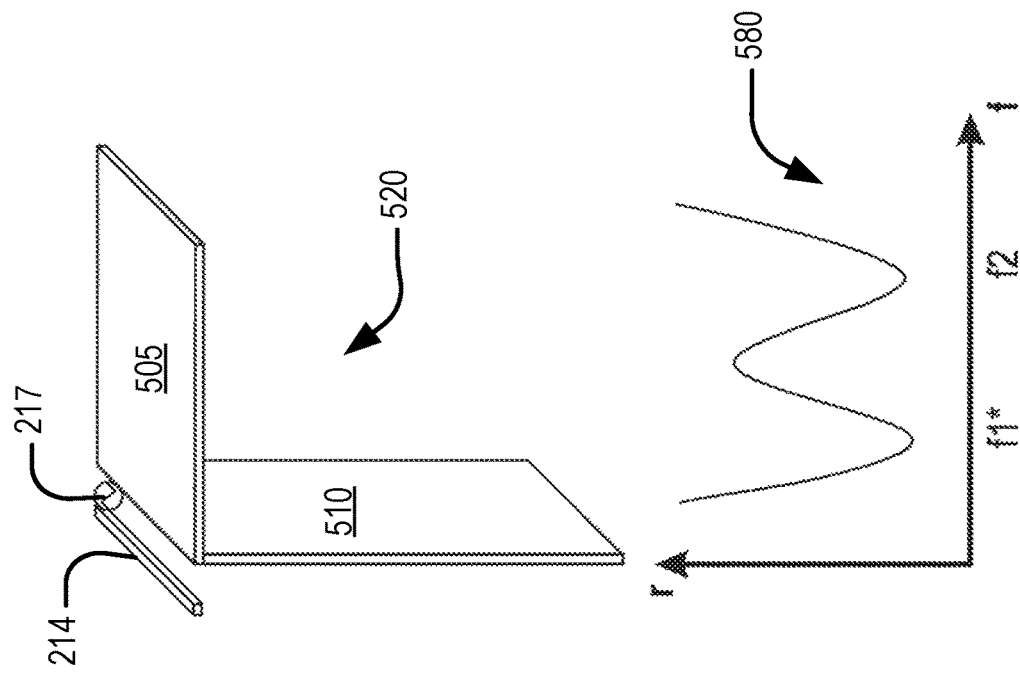
FIG. 5B is a schematic representation corresponding to FIG. 5A, with the ground planes being provided by PCB extenders with different lengths, according to an example embodiment.
Figure 5A:
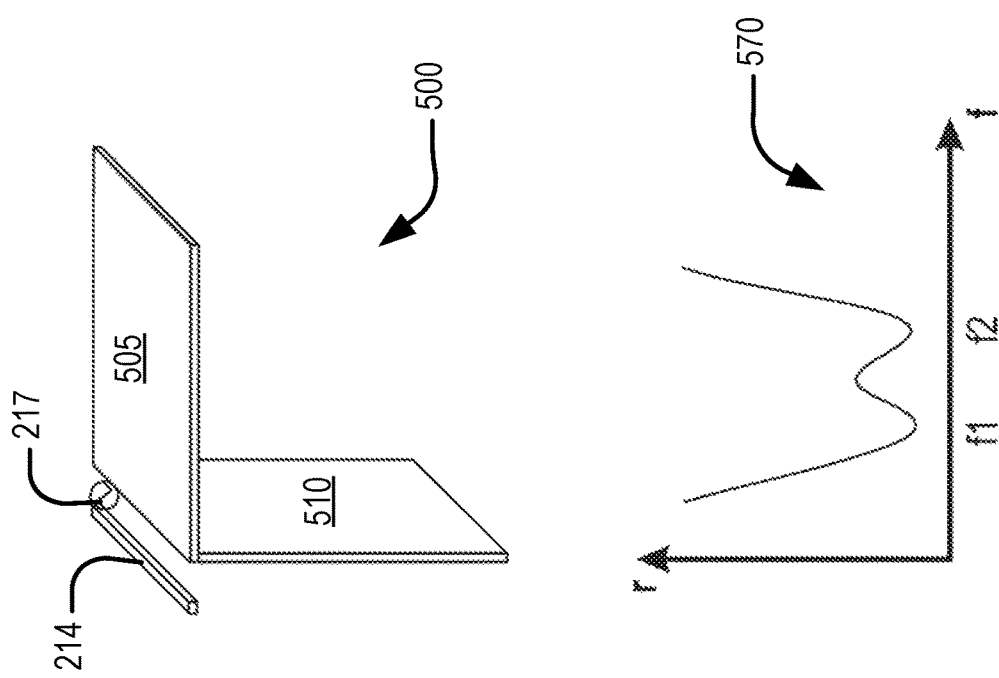
FIG. 5A is a schematic representation of an antenna system having a plurality of mutually transverse ground planes cooperating with a common driven antenna element, according to an example embodiment

FIG. 5A illustrates an idealized schematic view of an example embodiment of an antenna system 500 having the disclosed multi-plane antenna configuration. In the example embodiment of FIG. 5A, the antenna system 500 uses an inverted-L antenna element 214 in combination with a plurality of mutually transverse ground planes. In this example embodiment, the plurality of ground planes is provided by a pair of ground planes 505, 510 that are orthogonal relative to one another. Moreover, both ground planes 505, 510 are in this example embodiment parallel to the inverted-L antenna element 214. For ease of description only, the ground planes are identified further as the horizontal ground plane 505 and the vertical ground plane 510.

In this example embodiment, each of the ground planes 505, 510 is provided by a respective PCB extender, being a conductive element electrically connected to the PCB ground plane. Each of these PCB extenders is significantly larger in length than the PCB 204, thus providing a respective ground plane much larger than the PCB ground plane. For this reason, the PCB ground plane is not shown in the schematic representations of FIGS. 5A and 5B. In other embodiments, one of the ground planes 505, 510 can be provided by the PCB ground plane, with the other ground plane being provided by a PCB extender oriented transversely thereto.

Note that the antenna element 214 is substantially coplanar with the horizontal ground plane 505, so that the antenna element 214 and the horizontal ground plane 505 can be considered together to define an ILA analogous to the configuration 410 in FIG. 4. The antenna element 214, however, is parallel to but spaced from the plane of the vertical ground plane 510, so that the antenna element 214 and the vertical ground plane 510 can be considered together to define a PILA analogous to the configuration 420 in FIG. 4. Thus, the multiplane antenna system 500 can be understood as a combination of the ILA 410 and the PILA 420, while sharing a common driven antenna element 214.

FIG. 5B shows a multiplane antenna system 520 analogous to the system 500 of FIG. 5A, except that the orthogonal ground planes 505, 510 differ in length. In this embodiment, the vertical ground plane 510 has an increased length. Graphs 570 and 580 show respective return loss performances for the antenna systems 500 and 520.

An analysis of current modes responsible for radiation in the ground planes 505, 510 reveals that, at frequency f1, fundamental mode is excited for the PILA provided in part by vertical ground plane 510, while the ILA provided in part by horizontal ground plane 505 is not excited. At frequency f2, however, fundamental mode is excited for the ILA provided in part by the ground plane 505, while the PILA of ground plane 510 overmodes. Thus, due to the length difference between the ground planes 505 and 510, two distinct radiating modes can be generated by using the same antenna element 214. By adjusting the lengths of these ground planes at design-time, it is possible to control the frequency in which these modes occur.

Consequently, if the ground planes 505 and 510 are of the same or closely similar length, then the antenna system 500 will have both fundamental modes in the same frequency but will radiate in different directions and will receive different polarizations. This is because the currents in the respective PCB extenders are orthogonal to each other. These phenomena will result in pattern and polarization diversity because the antenna system 500 can "see" a broader area, limit its dead spots and immunize the antenna system from polarization mismatches.

Figure 6:
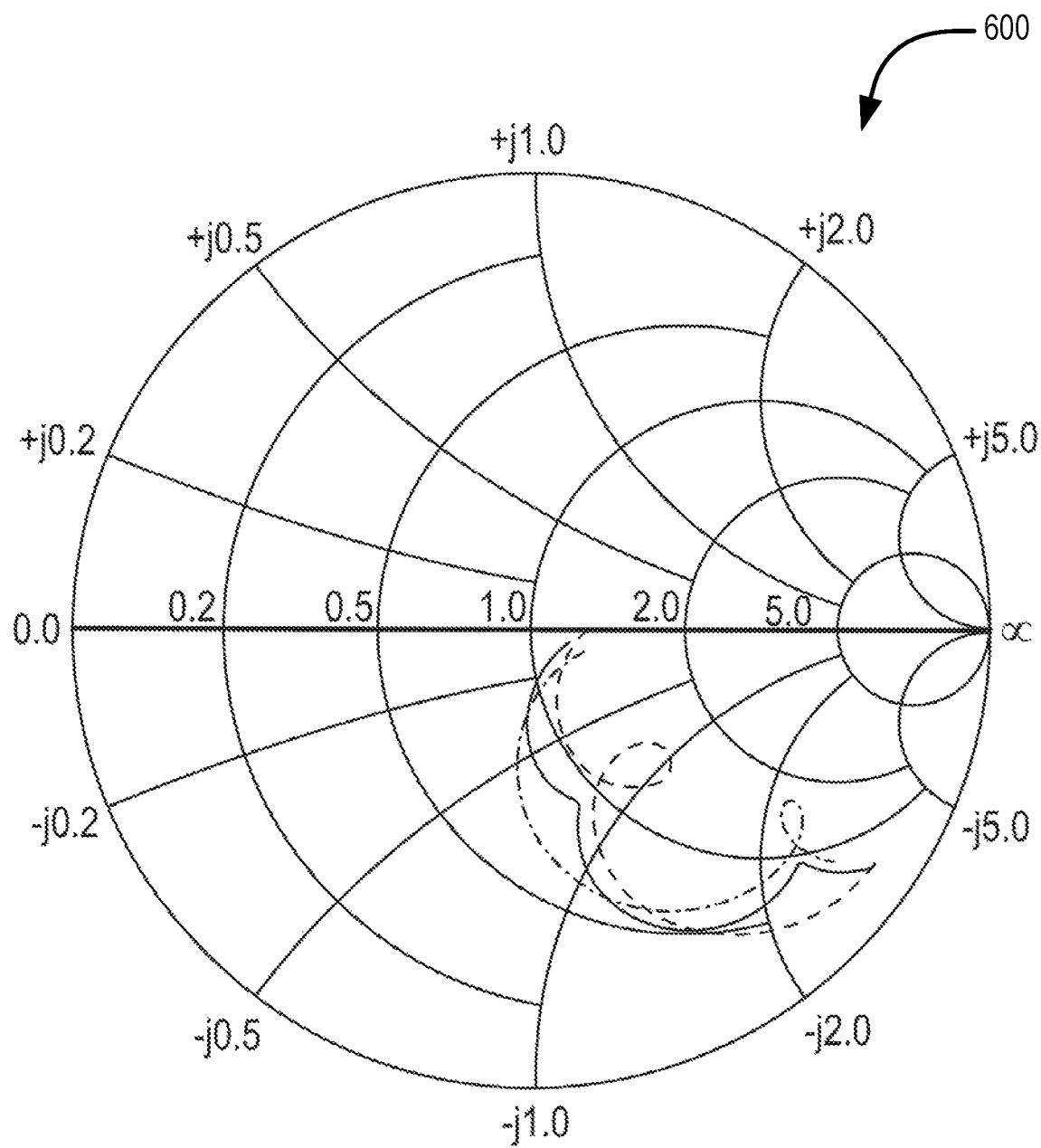
FIG. 6 shows a comparative graph illustrating impedance behavior of a planar inverted-L antenna (FIG. 4), an inverted-L antenna (FIG. 4), and a multiplane antenna system according to the example embodiment of FIG. 5A.

FIG. 6 shows an impedance behavior graph 600 of the multiplane antenna system 505 with ground planes of different length. In the graph 600, the solid line indicates the impedance behavior of the composite antenna system 505; the chain-dotted line indicates the impedance behavior of the ILA component provided by ground plane 505 together with the antenna element 214; and the chain-dotted line indicates the impedance behavior of the PILA component provided by ground plane 500 together with the antenna element 214. As can be seen from graph 600, when the PCB extension ground planes are of different lengths, then the antenna system 520 can radiate at different frequencies, achieving multi-band capability. The solid line clearly shows the two modes of radiation, whereas the broken and chain-dotted lines are single radiation modes.

Note that although the behavior of multi-plane antenna system 500 is described with reference to an inverted-L antenna 214, the discussed considerations apply analogously to configurations in which multiple ground planes (e.g., 505 and 510) are used in combination with a monopole or a dipole driven antenna element, such as the antenna element 206 discussed with reference to system 202 in FIG. 1. The example embodiments discussed below with reference to FIGS. 7-9, for example, employ multiplane configurations with non-inverted antennas 216.

Implementation of the above concepts in electronic devices in some embodiments comprise defining one or more antenna ground planes (in addition to that provided by the PCB) by incorporating in the device one or more PCB extenders, being respective electrically conductive elements that are electrically coupled to the PCB ground plane and that extend transversely relative to a driven antenna element.

An example of one such an implementation is illustrated with reference to FIG. 7, which shows an eyewear device 100 analogous to that of FIGS. 2 and 3, with the additional provision of a pair of substantially orthogonal PCB extenders 814, 821. FIG. 8 shows an idealized schematic version of a resultant multiplane antenna system 707 forming part of the eyewear device of FIG. 7.

In this example embodiment, the PCB extenders 814, 821 are provided by respective copper wires that are electrically connected to the PCB 204, for example by contact fastener, soldering, or the like. In some embodiments, the electrical connection between the PCB 204 and one or more of the PCB extenders 818, 821 can be inductive.

The PCB extension wires in this example embodiment comprises a top wire 714 extending along a top bar defined by upper portions of the respective lens rims 115 and bridge 118 extending between them, and a temple wire 721 extending along the temple 109 that is hingedly connected to the frame 106 at the end piece 121 in which the PCB 204 is housed. Note that both of these wires are in this example embodiment fully embedded and encased by the polymeric plastics material of the frame 106 and temple 109. Note that the plastics material of the temple 109 in question is omitted in FIG. 7 to afford a clear view of the temple wire 721. In some embodiments, one or more conductors providing respective PCB extenders may be exposed on an exterior of the eyewear device 100, for example provided by metallic trim pieces.

Figure 7:
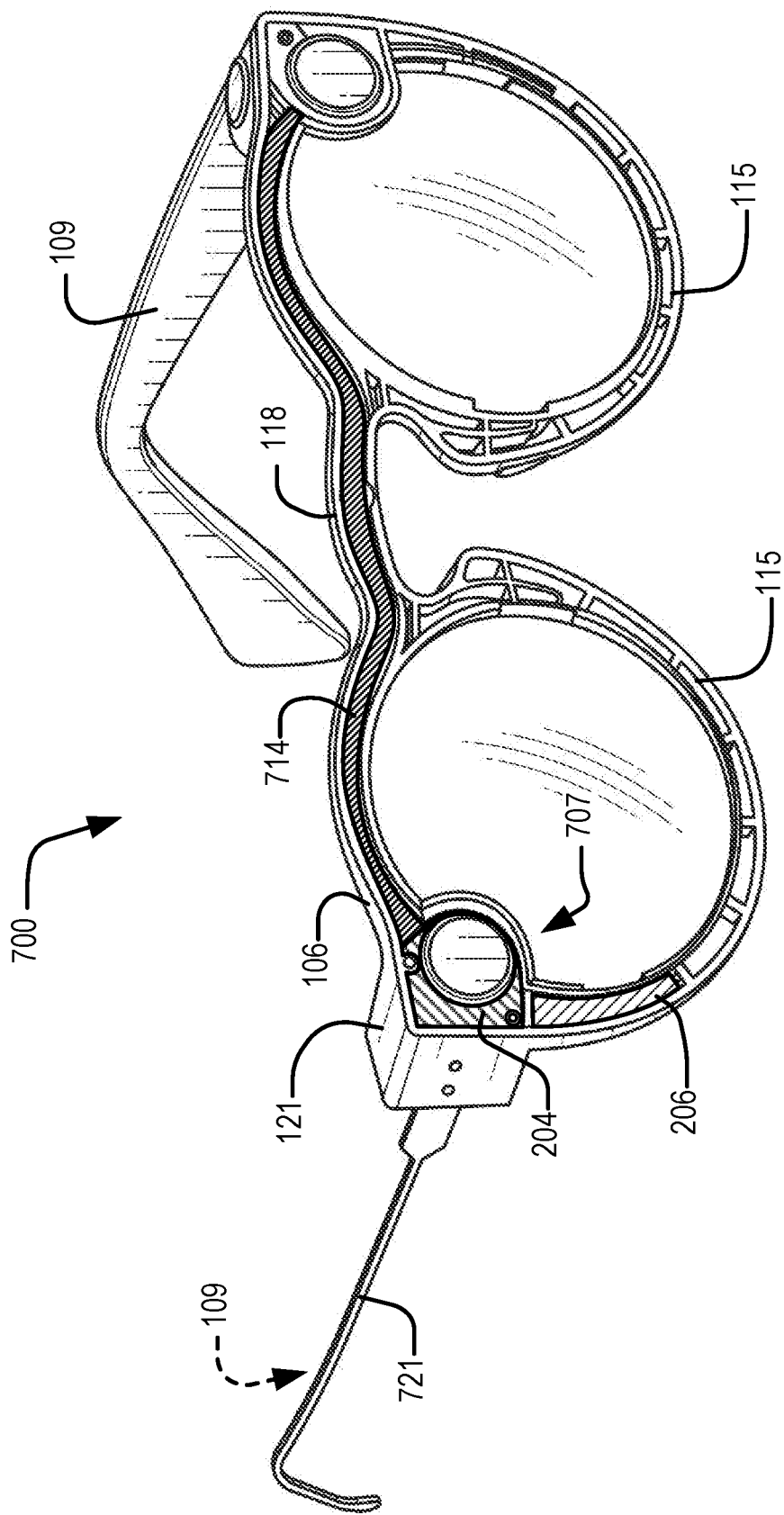
FIG. 7 is a partially sectioned three-dimensional view of an eyewear device according to an example embodiment, the eyewear device having incorporated therein an antenna system having two transverse ground planes provided respectively by a PCB extender along one temple of the device, and a PCB extender extending laterally across a frame of the device.
Figure 8:
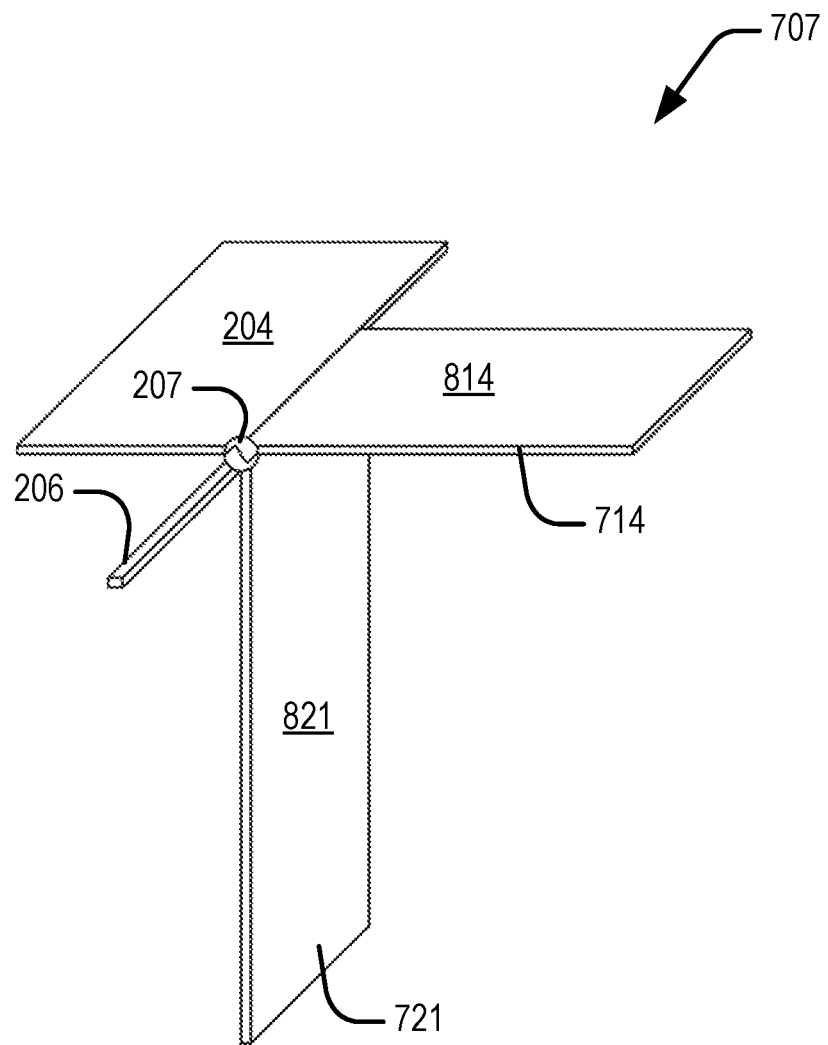
FIG. 8 is an idealized schematic representation of an antenna system forming part of an eyewear article according to the example embodiment of FIG. 7.

Turning now to FIG. 8, note that the antenna system 707 is shown in an orientation different from that in FIG. 7, corresponding instead to the orientation of FIGS. 5A and 5B. With respect to the schematic diagram of FIG. 8, it will be appreciated that the top wire 714 defines ground plane 814, while the ground plane 821 (oriented vertically in FIG. 8) is defined by the temple wire 721. The remaining schematic ground plane in FIG. 8 is the PCB ground plane provided by the PCB 204. This configuration therefore provides a combination of a single antenna 206 with three ground planes (204, 814, and 821) for pattern polarization diversity and multiband operation. One of these ground planes 821 is substantially orthogonal to the other two ground planes 204, 814.

Note that the driven antenna element 206 is shown in FIG. 8 to be coplanar both of the ground planes 814, 821 defined by the respective PCB extenders 714, 721. The antenna element 206 can, however, in some embodiments be offset from one or both of the additional ground planes 814, 821. In other embodiments, the common antenna element may be provided by an inverted-L antenna such as that described with reference to FIG. 5B.

In addition, note that the temple wire 721 is in this embodiment configured for disconnection and reconnection with the PCB ground plane together with hinged displacement of the corresponding temple 109 relative to the frame 106. In usual fashion, the temples 109 are typically folded flat against the frame when the glasses are disposed in a stowed configuration, and are hinged away from the frame 106 into the configuration shown in FIG. 8 when the eyewear device 100 is to be worn. A coupling may be incorporated in the articulated joint between the frame 106 and the temple 109 such as automatically to connect the temple wire 721 to the ground plane of the PCB 204 when the temple 109 is in the extended configuration. Such a coupling may be constructed and configured analogously to that described in the disclosure in any of Applicant's U.S. Pat. No. 9,726,904, titled EYEWEAR WITH CONDUCTIVE TEMPLE JOINT (filed Sep. 29, 2015 as application Ser. No. 14/869,149); U.S. Pat. No. 9,482,882 titled EYEWEAR HAVING SELECTIVELY EXPOSABLE FEATURE (filed Apr. 15, 2015 as application Ser. No. 14/687, 308); and U.S. Pat. No. 9,482,882 titled EYEWEAR HAVING LINKAGE ASSEMBLY BETWEEN A TEMPLE AND A FRAME (filed Apr. 15, 2015 as Ser. No. 14/687, 308), each of which are incorporated herein by reference in their entirety.

Note that, in some embodiments, as described below with reference to the fourth aspect of the disclosure, the PCB extenders 714, 721 may additionally function as heatsinks, being thermally connected in a heat transfer relationship with the PCB 204 and/or other heat sources in the associated end piece 121. In such instances, the temple joint may be configured to provide automatic connection and disconnection of both an electrical and a thermal connection between the temple wire 721 and the PCB 204 responsive to opening and/or closing of the temple 109. In some embodiments, electrical and thermal interface between the relevant wire 714, 721 and the PCB 204 can be provided by a single connection.

At least some of the PCB extenders 714, 721 in some embodiments serve triple functions of not only defining a ground plane for the antenna system 707 and serving as a heat sink, but can additionally be a mechanical or structural component of the device component of which they form part. For example, the temple wire 721 serves as a core wire for the temple 109, providing structural integrity and rigidity of the temple. The same applies in some embodiments to the top wire 118. In some such embodiments, a polymeric plastics material of the frame 106 or temple 109 is molded over the respective core wire PCB extender.

As will be understood from the earlier discussion with reference to FIGS. 5-7, the PCB extenders 714, 721 as described provide the driven antenna element 206 with additional and longer ground planes 814, 821, thus providing pattern-polarization diversity and, in some embodiments, also multi-band operation. Note that the lengths and/or shapes of the respective PCB extenders 714, 721 may be selected such as to provide desired composite antenna performance. In embodiments where the antenna system 707 is configured for multiband operation, communication electronics of the PCB 204 is configured for cooperation with the antenna system 707 to facilitate multiband wireless communication. Thus, for example, the communication electronics in some such embodiments include a transceiver connected to a diplexer to provide frequency-domain discrimination between signals received in different frequency bands.

In some embodiments, the antenna system 707 may include one or more different PCB extenders instead of or in addition to a pair of orthogonal extenders such as the top wire 714 and the temple wire 721. One such example embodiment is illustrated in FIG. 9, which shows an eyewear device 900 analogous to the eyewear device 700 of FIG. 7 by incorporating a number of additional PCB extenders.

An antenna system 903 of the eyewear device 900 is largely similar to the antenna system 707 described with reference to FIG. 7, except that it has a number of additional extension wires to define respective ground planes that are spaced from and/or transverse to another. These PCB extenders include three rim wires 909, 918, and 927 extending partially along a respective lens holders 115. Note that these rim wires in this example embodiment correspond more or less in orientation and dimension to the driven antenna element 206, being laterally spaced therefrom. A further PCB extender is provided by a second temple wire 936 extending along the temple 109 furthest from the PCB 204. Earlier considerations with respect to hinged connectivity, thermal conductivity, and structural functionality apply equally to both temple wires 721 and 936.

Figure 9:
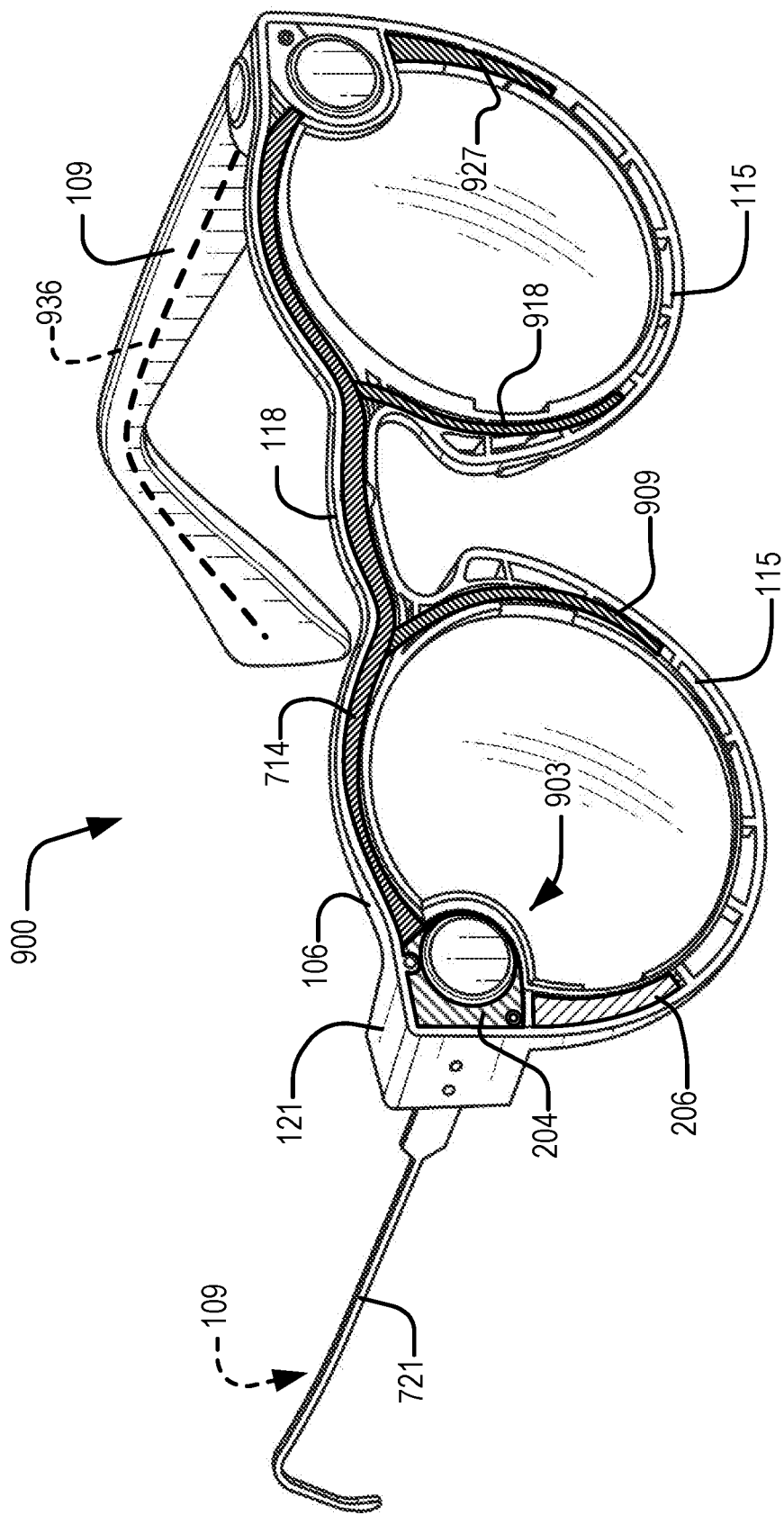
FIG. 9 is a partially sectioned three-dimensional view of an eyewear device with a multi-plane wireless communication system, according to another example embodiment.

Thus, it will be seen that the embodiment of FIG. 9 provides a number of additional ground planes, essentially increasing the number of bands that the antenna can support.

As exemplified by the example embodiments of FIGS. 7-9, it will be seen that, worded differently, the second aspect of the disclosure provides an antenna system comprising:

a PCB housing on-board electronics;

a driven antenna element connected to the PCB for transmitting signals to and/or from the electronics on the PCB; and at least one PCB extender electrically connected to the PCB and projecting from the PCB to define a respective ground plane for co-operation with the driven antenna element in signal reception/transmission.

This aspect of the disclosure extends to an electronic device and to an electronics-enabled eyewear device that incorporates such an antenna system. In some embodiments, a plurality of PCB extenders may be provided in mutually transverse orientations, thereby to define a plurality of transverse antenna ground planes.

In some embodiments, the PCB extenders are conductive elements having a length three or more times greater than the largest dimension of the PCB. In some embodiments, such as that described with reference to FIG. 7, the PCB extenders are essentially one-dimensional elements, for example being metal wires extending transversely to one another. In other embodiments, however, one or more of the PCB extenders may be provided by a substantially planar element, such as a metal plate.

Note that the disclosed antenna system is not limited to use in eyewear devices, such as those disclosed herein. Instead, it is envisaged that the benefits provided by the disclosed antenna systems can find beneficial implementation in many different devices and components. It will be appreciated that the size and orientation of the PCB extenders will in different embodiments be influenced or dictated by the physical dimensions of the device or article in which it is incorporated. Provision, for example, of the disclosed antenna system on a motor vehicle will allow use of at least one planar PCB extender located with a roof panel of the vehicle. Note also that the antenna system incorporated in a device may in some embodiments have a common inverted antenna, such as that described with reference to FIGS. 5A and 5B, instead of having the configuration exemplified in the eyewear device of FIG. 7 and represented schematically in FIG. 8.

As mentioned previously, one or more of the PCB extenders may in some embodiments additionally be connected to the PCB to be in heat transfer relationship with one or more heat sources on the PCB or otherwise housed in the device body, thereby to serve as respective heat sinks for heat-generating electronic components of the device. In such cases, the mass of the respective PCB extenders can be greater than that which is required for signal transmission/reception purposes, thereby to provide greater thermal mass for the corresponding heat sink. In the example embodiment of FIG. 7, for example, each of the PCB extenders 714, 721 is a copper wire that is in contact coupling with the PCB 204 for thermal transfer, and has a thickness at or approaching a maximal thickness permitted by the physical dimension of the particular device components in which the wires are located.

A fourth aspect of the disclosure thus provides a device (e.g., a wearable device) comprising:

a device body;

a PCB carrying device electronics housed by the device body; and an antenna system connected to the PCB for providing wireless connectivity thereto, the antenna system comprising at least one heat sink element that projects from the PCB and that is connected to the PCB for both electrical and thermal conduction, so that the at least one heat sink element performs dual functions of:

contributing to signal reception/transmission by the antenna system, and providing a heat sink for the device electronics.

The heat management characteristics of the one or more heat sink elements forming part of the antenna system may be similar or analogous to those described for the heat sink elements of Applicant's prior patents no. U.S. Pat. No. 9,851,585, titled HEAT SINK CONFIGURATION FOR WEARABLE ELECTRONIC DEVICE (filed Mar. 18, 2016 as application Ser. No. 15/073,856); U.S. Pat. No. 9,740,023, titled WEARABLE DEVICE WITH HEAT TRANSFER PATHWAY (filed Mar. 30, 2016 as application Ser. No. 15/084,683); and U.S. application Ser. No. 15/425,774, titled HEAT MANAGEMENT FOR ELECTRONIC DEVICES, filed Feb. 6, 2017, all of which are incorporated herein by reference in their entirety.

In some embodiments, only one of the antenna system components is thermally connected to the PCB for heat management purposes. One example of such an embodiment is described with reference to FIG. 3, in which the driven antenna element 206 serves as a heat sink element. In one embodiment of an eyewear device analogous to that described with reference to FIG. 7, only the antenna element 206 is in heat transfer relationship with the PCB or other electronic components, with the PCB extenders 714, 721 thermally isolated from heat-generating electronic components. In other embodiments, the driven antenna element may be thermally isolated from the PCB, the one or more heat sink elements being provided by respective PCB extenders.

In other embodiments, two or more of the PCB extenders may serve as heatsinks. For example, in an embodiment analogous to that described with reference to FIG. 7, both the top wire 714 and the temple wire 721 may be heat sinks. Similarly, in the example embodiment of FIG. 9, all of the various PCB extender wires may be thermally connected, directly or indirectly, to the PCB for heat management purposes.

From the preceding description, it will be seen that a number of example embodiments and combination of embodiments are disclosed. These include, but are not limited to, the list of example embodiments that follow.

Example 1

An antenna system comprising:
a driven antenna element;
a printed circuit board (PCB) that carries on-board electronics communicatively coupled to the driven antenna element to communicate wireless signals via the driven antenna element, the PCB defining a PCB ground plane for co-operation with the driven antenna element in signal communication; and
a PCB extender comprising a conductor electrically connected to the PCB ground plane and projecting from the PCB for co-operation with the driven antenna element in signal communication.

Example 2

The antenna system of example 1, which comprises a plurality of PCB extenders electrically connected to the PCB ground plane and projecting from the PCB in mutually transverse orientations, thereby defining a plurality of mutually transverse ground planes for the driven antenna element. At least one of the plurality of PCB extenders may form a structural component of a device in which the antenna system is incorporated.

Example 3

The antenna system of example 2, wherein the plurality of PCB extenders comprises a pair of PCB extenders that are substantially orthogonal relative to one another.

Example 4

The antenna system of example 2 or example 3, wherein each of the plurality of PCB extenders comprises a wire conductor. Thus, each of the plurality of PCB extenders may be a substantially one dimensional component. In other embodiments, at least one of the PCB extenders may be a substantially two-dimensional or planar conductor.

Example 5

The antenna system of any one of examples 2-4 wherein the driven antenna element is a non-loop conductor connected at one end thereof to a signal feed provided by the PCB electronics. Thus, the driven antenna element may in some embodiments be a monopole antenna element, and may in other embodiments be a dipole antenna element.

Example 6

The antenna system of any one of examples 2-5, wherein the system is incorporated in an electronics-enabled device, the driven antenna element and the plurality of PCB extenders being housed within a body of the device.

Example 7

The antenna system of example 6, wherein the device is an eyewear device, the body of the eyewear device comprising an eyewear frame defining one or more optical element holders for holding respective optical elements within view of a user when the eyewear device is worn, at least one of the driven antenna element and the plurality of PCB extenders being incorporated in the eyewear frame.

Example 8

The antenna system of example 6 or example 7, wherein at least one of the plurality of PCB extenders forms a support element providing increased structural rigidity to at least part of the body of the device.

Example 9

The antenna system of example 8, wherein one or more of the plurality of PCB extenders forms a core wire for a molded component of the device body. In other embodiments of this example, one or more of the plurality of PCB extenders may form a core wire for a non-molded component of the device body.

Example 10

The antenna system of any one of examples 2-9, wherein one or more antenna components selected from the group comprising the driven antenna element and the plurality of PCB extenders comprises a thermally conductive element that is connected to the PCB to be in heat transfer relationship with one or more heat sources on the PCB, thereby to serve as a heat sink for the electronics on the PCB.

Example 11

The antenna system of example 10, wherein at least one of the plurality of PCB extenders comprises a metal wire connected both electrically and thermally to the PCB. In a particular example embodiment, the at least one PCB extender is a copper wire.

Example 12

A device comprising:
a device body;
a driven antenna element housed by the device body;
  a printed circuit board (PCB) that is housed by the device body and that carries on-board communication electronics coupled to the driven antenna element to communicate wireless signals via the driven antenna element, the PCB defining a PCB ground plane coupled to the communication electronics for co-operation with the driven antenna element in signal communication; and
one or more PCB extenders housed by the body, each PCB extender comprising a conductor electrically connected to the PCB ground plane and projecting from the PCB for co-operation with the driven antenna element in signal communication.

Example 13

The device of example 12, wherein the one or more PCB extenders comprise a pair of PCB extenders projecting from the PCB in mutually transverse orientations, the pair of PCB extenders defining a pair of mutually transverse ground planes for the driven antenna element.

Example 14

The device of example 13, wherein the driven antenna element projects from the PCB in a direction transverse to both of the pair of PCB extenders.

Example 15

The device of any one of examples 12-14, wherein the device is an eyewear device, the device body comprising an eyewear frame defining one or more optical element holders (e.g., lens rims) for holding respective optical elements (e.g., lenses) within view of a user when the eyewear device is worn, at least one of the driven antenna element and the one or more PCB extenders being incorporated in the eyewear frame.

Example 16

The device of example 15, wherein at least one of the driven antenna element and the one or more PCB extenders extends along a part of one of the one or more optical element holders.

Example 17

The device of example 15 or example 16, wherein one of the one or more PCB extenders extends along an operatively top portion of the eyewear frame, having a sideways orientation relative to a direction of view of the eyewear device.

Example 18

The device of any one of examples 15-17, wherein the device body further includes a pair of temples connected to the eyewear frame for supporting the eyewear frame in position during wear, a first PCB extender comprising a wire extending along one of the pair of temples.

Example 19

The device of example 18, wherein:
a second PCB extender comprises a wire extending along the eyewear frame in a direction sideways relative to a direction of view of the eyewear device, such that the second PCT extender is substantially orthogonal to the first PCB extender; and
wherein the driven antenna element extends along at least part of a respective optical element holder defined by the eyewear frame, the driven antenna element being substantially orthogonal to both the first PCB extender and the second PCB extender.

Example 20

The device of any one of examples 15-19, wherein at least one of the one or more PCB extenders forms a core wire that provides structural integrity to a corresponding device body component in which it is located.

Example 21

An eyewear device comprising:
an eyewear body configured to support one or more optical elements within view of a user;
onboard electronics housed by the eyewear body, the onboard electronics including a printed circuit board (PCB); and
an antenna system housed by the eyewear body and connected to the PCB to provide wireless connectivity thereto, the antenna system comprising a heat sink element that comprises a conductor which is both:
  thermally connected to a heat-generating component of the onboard electronics to provide a heat sink for the heat-generating component; and
  electrically connected to the PCB to contribute to the communication of wireless signals via the antenna system.

Example 22

The eyewear device of example 21, wherein the heat sink element comprises a driven antenna element that is communicatively coupled to the PCB.

Example 23

The eyewear device of example 22 wherein the heat sink element projects transversely away from the PCB and is encased in the eyewear body.

Example 24

The eyewear device of example 23, wherein the eyewear body comprises an eyewear frame defining at least one optical element holder configured to hold a respective optical element, the driven antenna element extending along a part of the optical element holder.

Example 25

The eyewear device of example 24, wherein the at least one optical element holder is a lens rim extending circumferentially around a lens held therein, the driven antenna element extending circumferentially along a part of the lens rim.

Example 26

The eyewear device of any one of examples 21-25, wherein the antenna system provides a plurality of heat sink elements which are thermally connected to one or more heat generating components, each of the plurality of heat sink elements being electrically connected to the PCB to contribute to the communication of wireless signals via the antenna system.

Example 27

The eyewear device of any one of examples 21-26 wherein the antenna system comprises:
an active antenna element communicatively coupled to the PCB, the PCB defining a PCB ground plane for cooperation with the driven antenna element in signal communication; and
one or more PCB extenders, each of which comprises a conductor electrically connected to the PCB ground plane and projecting from the PCB for cooperation with the driven antenna element in signal communication,
wherein the heat sink element is selected from the group comprising: the driven antenna element and the one or more PCB extenders.

Example 28

The eyewear device of example 27, wherein the heat sink element comprises an extender heat sink provided by one of the one or more PCB extenders.

Example 29

The eyewear device of example 28, wherein the extender heat sink comprises a wire conductor extending laterally across an eyewear frame forming part of the eyewear device, relative to an operative direction of view through the one or more optical elements.

Example 30

The eyewear device of example 28 or 29, wherein the eyewear body comprises:
an eyewear frame for holding one or more optical elements; and
a pair of temples connected to the eyewear frame for supporting the eyewear frame on the face of a user,
wherein the extender heat sink comprises a wire conductor extending along one of the pair of temples.

Example 31

The eyewear device of any one of examples 28-30, comprising a plurality of extender heat sinks provided by a corresponding plurality of PCB extenders that project from the PCB in mutually transverse directions.

Example 32

The eyewear device of any one of examples 28-31, wherein the extender heat sink forms a support element providing increased structural rigidity to a corresponding part of the eyewear body.

Example 33

The eyewear device of example 32, wherein the extender heat sink is a core wire of the corresponding part of the eyewear body.

Example 34

The eyewear device of any one of examples 21-33, wherein the heat sink element is thermally connected to the PCB.

Example 35

A wireless communication system comprising:
a printed circuit board (PCB); and
an antenna system connected to the PCB to provide wireless connectivity thereto, the antenna system comprising a heat sink element that comprises a conductor which is both:
  thermally connected to the PCB, being in heat transfer relationship with the PCB and configured to provide a heat sink for the PCB; and
  electrically connected to the PCB to contribute to the communication of wireless signals via the antenna system.

Example 36

The wireless communication system of example 35 wherein the heat sink element comprises an active antenna element that is communicatively coupled to the PCB.

Example 37

The wireless communication system of example 35, wherein the antenna system comprises:
an active antenna element communicatively coupled to the PCB, the PCB defining a PCB ground plane for cooperation with the driven antenna element in signal communication; and
one or more PCB extenders, each of which comprises a conductor electrically connected to the PCB ground plane and projecting from the PCB for cooperation with the driven antenna element in signal communication,
wherein the heat sink element is provided by one of the one or more PCB extenders.

Example 38

An electronic device comprising:
a body;
onboard electronics housed by the body, the onboard electronics including a printed circuit board (PCB); and
an antenna system housed by the body and connected to the PCB to provide wireless connectivity thereto, the antenna system comprising at least one heat sink element that comprises a conductor which is both:
thermally connected to a heat-generating component of the onboard electronics to provide a heat sink for the generating component; and
electrically connected to the PCB to contribute to the communication of wireless signals via the antenna system.

Example 39

The electronic device of example 38, wherein the at least one heat sink element is both thermally and electrically connected to the PCB.

Example 40

The electronic device of example 39, wherein the antenna system comprises:
an active antenna element communicatively coupled to the PCB, the PCB defining a PCB ground plane for cooperation with the driven antenna element in signal communication; and
one or more PCB extenders, each of which comprises a conductor electrically connected to the PCB ground plane and projecting from the PCB for cooperation with the driven antenna element in signal communication,
wherein the at least one heat sink element is selected from the group comprising: the driven antenna element and the one or more PCB extenders.

Example 41

An electronic device that includes an antenna system according to any one of examples 1-11 or 35-37.

Example 42

An eyewear device that includes an antenna system according to any one of examples 1-11 or 35-37.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the disclosed matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

What is claimed is:

1. An eyewear device comprising:
an eyewear body configured to support one or more optical elements within view of a user;
onboard electronics housed by the eyewear body, the onboard electronics including a printed circuit board (PCB); and
an antenna system housed by the eyewear body and connected to the PCB to provide wireless connectivity thereto, the antenna system comprising:
a driven antenna element communicatively coupled to the PCB, the PCB defining a PCB ground plane for cooperation with the driven antenna element in signal communication;
one or more PCB extenders, each of which comprises a conductor electrically connected to the PCB ground plane and projecting from the PCB for cooperation with the driven antenna element in signal communication; and
a heat sink element provided by the respective conductor of a particular one of the PCB extenders the heat sink element being thermally connected to a heat-generating component of the onboard electronics to provide a heat sink for the heat-generating component.

2. The eyewear device of claim 1, further having an additional heat sink element that comprises a driven antenna element that is communicatively coupled to the PCB.

3. The eyewear device of claim 2, wherein the heat sink element projects transversely away from the PCB and is encased in the eyewear body.

4. The eyewear device of claim 3, wherein the eyewear body comprises an eyewear frame defining at least one optical element holder configured to hold a respective optical element, the driven antenna element extending along a part of the at least one optical element holder.

5. The eyewear device of claim 4, wherein the at least one optical element holder is a lens rim extending circumferentially around a lens held therein, the driven antenna element extending circumferentially along a part of the lens rim.

6. The eyewear device of claim 1, wherein the antenna system provides a plurality of heat sink elements which are thermally connected to one or more heat generating components, each of the plurality of heat sink elements being electrically connected to the PCB to contribute to the communication of wireless signals via the antenna system.

7. The eyewear device of claim 1, wherein the heat sink element comprises a wire conductor extending laterally across an eyewear frame forming part of the eyewear device, relative to an operative direction of view through the one or more optical elements.

8. The eyewear device of claim 1, wherein the eyewear body comprises:
an eyewear frame for holding one or more optical elements; and
a pair of temples connected to the eyewear frame for supporting the eyewear frame on the face of a user,
wherein the heat sink element comprises a wire conductor extending along one of the pair of temples.

9. The eyewear device of claim 1, comprising a plurality of heat sinks provided by a corresponding plurality of PCB extenders that project from the PCB in mutually transverse directions.

10. The eyewear device of claim 1, wherein the heat sink element forms a support element providing increased structural rigidity to a corresponding part of the eyewear body.

11. The eyewear device of claim 10, wherein the heat sink element is a core wire of the corresponding part of the eyewear body.

12. A wireless communication system comprising:
a printed circuit board (PCB); and
an antenna system connected to the PCB to provide wireless connectivity thereto, the antenna system comprising:
a driven antenna element communicatively coupled to the PCB, the PCB defining a PCB ground plane for cooperation with the driven antenna element in signal communication;
one or more PCB extenders, each of which comprises a conductor electrically connected to the PCB ground plane and projecting from the PCB for cooperation with the driven antenna element in signal communication; and
a heat sink element provided by the respective conductor of a particular one of the PCB extenders the heat sink element being thermally connected to the PCB to provide a heat sink for the PCB.

13. The wireless communication system of claim 12, further having an additional heat sink element that comprises a driven antenna element that is communicatively coupled to the PCB.

14. An electronic device comprising:
a body;
onboard electronics housed by the body, the onboard electronics including a printed circuit board (PCB); and
an antenna system housed by the body and connected to the PCB to provide wireless connectivity thereto, the antenna system:
a driven antenna element communicatively coupled to the PCB, the PCB defining a PCB ground plane for cooperation with the driven antenna element in signal communication;
one or more PCB extenders, each of which comprises a conductor electrically connected to the PCB ground plane and projecting from the PCB for cooperation with the driven antenna element in signal communication; and
a heat sink element provided by the respective conductor of a particular one of the PCB extenders, the heat sink element being thermally connected to a heat-generating component of the onboard electronics to provide a heat sink for the heat-generating component.

15. The electronic device of claim 14, wherein the heat sink element is both thermally and electrically connected to the PCB.

* * * * *

UNITED STATES PATENT AND TRADEMARK OFFICE
CERTIFICATE OF CORRECTION

| | | |
|---|---|---|
| PATENT NO. | : 11,181,757 B1 | |
| APPLICATION NO. | : 15/913781 | |
| DATED | : November 23, 2021 | |
| INVENTOR(S) | : Ashwood et al. | |

It is certified that error appears in the above-identified patent and that said Letters Patent is hereby corrected as shown below:

On the Title Page

In item (71), in "Applicant", in Column 1, Line 1, delete "Venice," and insert --Santa Monica,-- therefor In the Claims In Column 20, Line 48, in Claim 1, after "extenders", insert --,--

In Column 22, Line 7, in Claim 12, after "extenders", insert --,--

Signed and Sealed this
Thirty-first Day of October, 2023

*Katherine Kelly Vidal*

Katherine Kelly Vidal
*Director of the United States Patent and Trademark Office*